United States Patent
Kitagawa et al.

(10) Patent No.: US 7,873,265 B2
(45) Date of Patent: *Jan. 18, 2011

(54) FILAMENT LAMP AND LIGHT IRRADIATION TYPE HEAT TREATMENT APPARATUS

(75) Inventors: Tetsuya Kitagawa, Himeji (JP); Yoichi Mizukawa, Himeji (JP); Shinji Suzuki, Tokyo-to (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 562 days.

This patent is subject to a terminal disclaimer.

(21) Appl. No.: 12/035,509

(22) Filed: Feb. 22, 2008

(65) Prior Publication Data

US 2008/0203924 A1 Aug. 28, 2008

(30) Foreign Application Priority Data

Feb. 26, 2007 (JP) ............................ 2007-045470

(51) Int. Cl.
*A21B 2/00* (2006.01)
*F26B 19/00* (2006.01)
(52) U.S. Cl. ..................... 392/416; 313/25; 313/297; 313/620; 313/621
(58) Field of Classification Search ............... 392/416; 313/25, 297, 620, 621
See application file for complete search history.

(56) References Cited

U.S. PATENT DOCUMENTS

| | | | |
|---|---|---|---|
| 6,876,816 B2 | 4/2005 | Shigeoka et al. | |
| 2006/0197454 A1 | 9/2006 | Mizukawa et al. | |

FOREIGN PATENT DOCUMENTS

| | | |
|---|---|---|
| DE | 100 24 709 A1 | 11/2001 |
| EP | 0 089 176 A2 | 9/1983 |
| EP | 0 222 553 A2 | 5/1987 |
| EP | 1 699 071 A1 | 9/2006 |
| JP | 4-329253 A | 11/1992 |
| JP | 7-37833 A | 2/1995 |
| JP | 7-16353 U | 3/1995 |

*Primary Examiner*—Thor S Campbell
(74) *Attorney, Agent, or Firm*—Roberts Mitokowski Safran & Cole, P.C.; David S. Safran

(57) ABSTRACT

A filament lamp comprising a bulb which has a hermetically sealed portion on at least one end and multiple filament assemblies, each filament assembly comprising a coiled filament and connected leads to supply power to that filament, the filament assemblies being sequentially arranged in the axial direction of the bulb, the leads of each filament assembly being electrically connected to respective multiple conductive parts set in the sealed portions, and power being independently suppliable to each of the filaments. A respective one of the coiled filaments is located in a respective first quadrant formed by intersecting planes that are perpendicular to each other and that are tangent to an outer coil diameter of the respective coiled filament. The leads are positioned in quadrants other than the quadrant in which the coiled filament is located. A light irradiation type heat treatment apparatus uses a plurality of such filament lamps.

10 Claims, 7 Drawing Sheets

Fig. 2
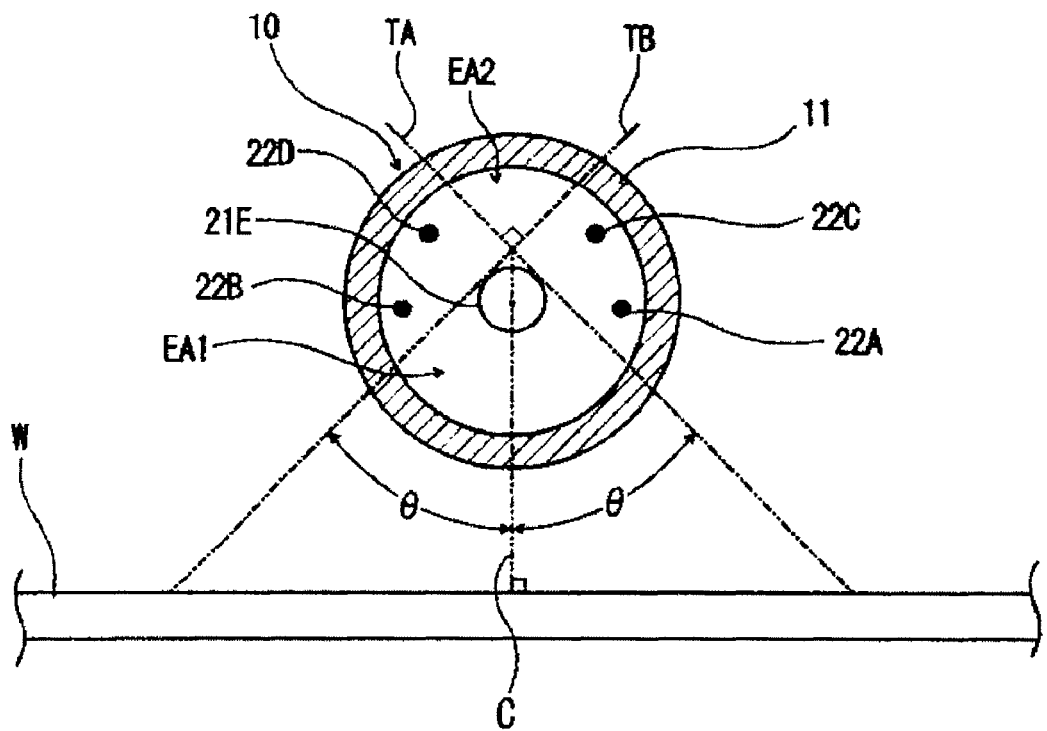
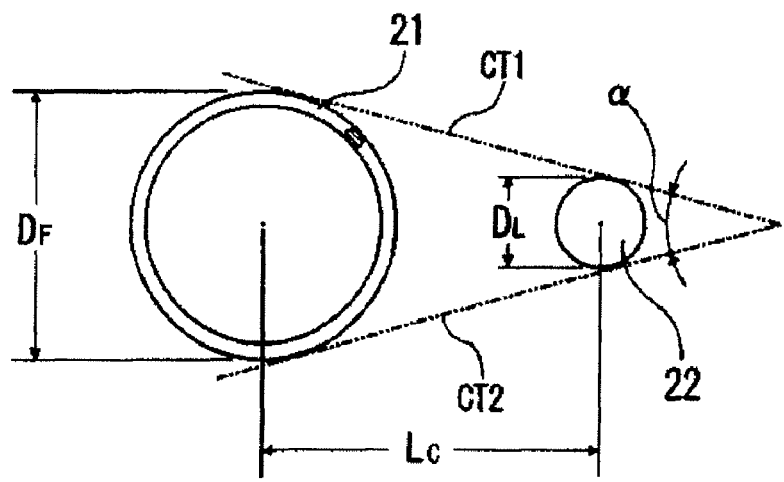
Fig. 3

Fig. 7
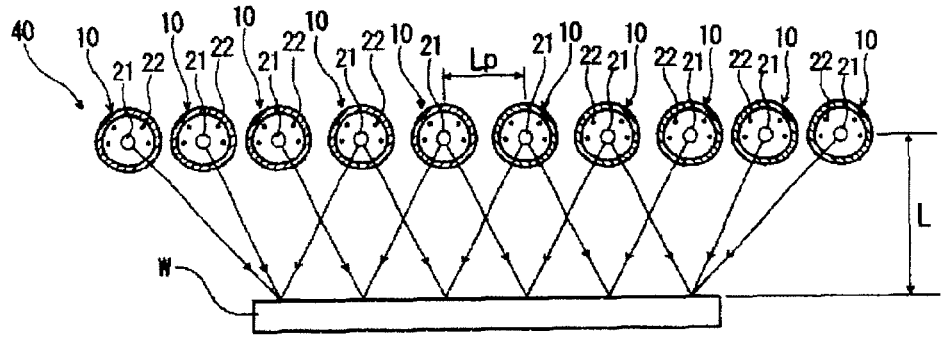
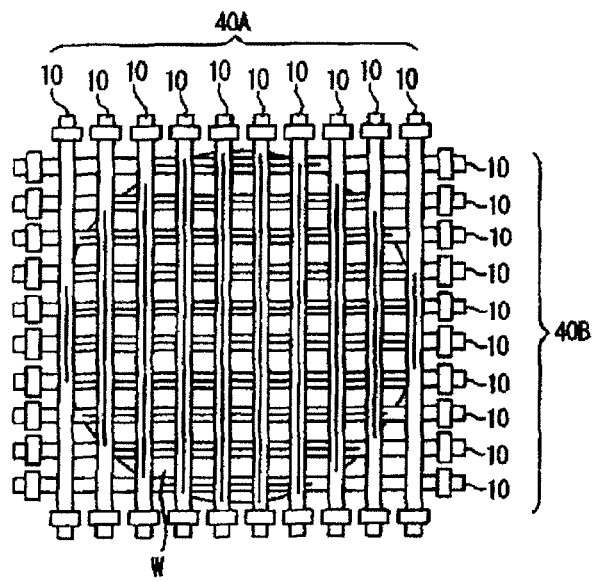
Fig. 8
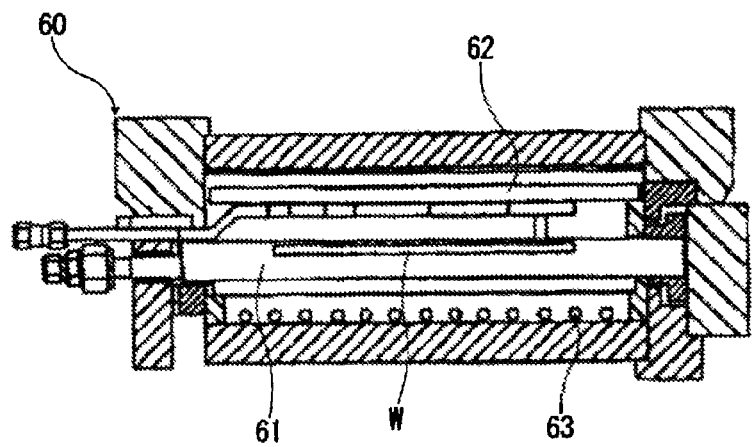
Fig. 9 (Prior Art)

FILAMENT LAMP AND LIGHT IRRADIATION TYPE HEAT TREATMENT APPARATUS

BACKGROUND OF THE INVENTION

1. Field of Invention

This invention concerns a filament lamp and light irradiation type heat treatment apparatus, and particularly, a filament lamp used for heat treatment of an article and light irradiation type heat treatment apparatus equipped with such a filament lamp.

2. Description of Related Art

Heat treatment is used in a variety of processes in the manufacture of semiconductors, including film growth, oxidation, nitriding, film stabilization, silicidation, crystallization, and ion implantation activation. In particular, rapid thermal processing (hereafter, RTP) of a semiconductor wafer or other article to be treated by quickly raising and lowering its temperature enables improved step size and quality, and so its use is desirable. Incandescent lamps, for example, are used as the light source in this type of light irradiation type heat treatment apparatus (simply "heat treatment apparatus" hereafter).

Incandescent lamps have filaments arranged inside bulbs made of a material that is transparent to light; they irradiate 90% or more of the invested power, and can heat the article W to be treated without making contact. Therefore, it is possible, when using them as heat sources for heating glass substrates or semiconductor wafers, to raise the temperature of the article to be treated more quickly than by the resistance heating method, specifically, to a temperature of 1000° C. or higher in a period from several seconds to several tens of seconds, and also to cool the article quickly by stopping the light irradiation.

When using light irradiation type heat treatment apparatus of this type to perform RTP of semiconductor wafers, for example, unevenness of the temperature distribution of a semiconductor wafer when it is heated to a temperature of 1050° C. or higher is liable to cause a phenomenon called "slip" in the semiconductor wafer, in which crystal transition defects arise and quality declines, and so it becomes necessary to heat the semiconductor wafer, hold it at a high temperature, and then cool it so that the temperature distribution will be even across the entire surface. In other words, highly precise uniformity of temperature of the article to be treated is sought in RTP.

Even in the event that the light irradiation is performed so that the degree of irradiation is even for semiconductor wafers that have the same treatment characteristics across the entire irradiated surface, at the edges of the semiconductor wafer heat will be radiated by the side surfaces of the semiconductor wafer, and so the temperature at the edges of the semiconductor wafer will be reduced and there will be unevenness in the temperature distribution of the semiconductor wafer.

To resolve problems of this sort, there have been attempts to make up for the temperature drop due to heat radiation from the sides of the semiconductor wafer, and thus, even out the temperature distribution in the semiconductor wafer by means of light irradiation of the surface at the edges of the semiconductor wafer to a greater degree than the surface at the center of the semiconductor wafer.

In conventional heat treatment apparatus, an arrangement is known like that shown in FIG. 9, for example, in which multiple incandescent lamps 62, 63 are located above and below a chamber 61 made of a light-transparent material; those above and those below face each other and their axes cross. Both surfaces of the article to be treated that is accommodated within the chamber 61 are heated by means of light irradiation from the incandescent lamps 62, 63 (see, Japanese Pre-grant Patent Publication H7-37833 of 1995).

In this heat treatment apparatus, as shown in FIG. 10, in the upper stage the lamp output of the incandescent lamps L1, L2 at both ends is greater than the output of the lamp output of the incandescent lamp L3 in the middle, and in the lower stage the lamp output of the incandescent lamps L4, L5 at both ends is greater than the output of the lamp output of the incandescent lamp L6 in the middle. By this means, it is said, the temperature drop due to heat radiation at the periphery WB of the article W to be treated can be compensated; the temperature difference between the center and periphery of the article W to be treated can be reduced and the temperature distribution of the article W to be treated can be made uniform.

In the conventional heat treatment apparatus 60 described above, however, there may be small, narrow, special regions WA on the article W to be treated that are very small relative to the length of the emitted light of the incandescent lamp, as shown in FIG. 10, and when light irradiation is done at a light intensity appropriate to the characteristics of these special regions WA, the regions other than the special regions WA are irradiated under the same conditions, and so it has not been possible with earlier heat treatment apparatus to adjust temperatures to provide suitable temperature conditions for both the special regions WA and the other regions, or in other words, to control only the degree of irradiation of the small, special regions so that the temperature status of the article W to be treated will be even.

For example, it is common to form a film of metallic oxide or other material on the surface of a semiconductor wafer by the sputtering method and then to dope it with impurities by means of ion implantation; the film thickness of such a metallic oxide and the density of the impurity ions will have a localized distribution on the surface of the semiconductor wafer. This localized distribution will not necessarily have symmetry with respect to the center of the semiconductor wafer; sometimes, with regard to the density of the impurity ions, for example, the density of the impurity ions varies in small, special regions that do not have central symmetry with respect to the center of the semiconductor wafer.

Even in the event that light irradiation is performed so that there is the same degree of irradiation of such special regions and the other regions, there will be differences between them in the speed of temperature rise and the temperature in the special regions will not necessarily be the same as the temperature in other regions.

Accordingly, in the conventional heat treatment apparatus 60 described above, there may be the problem that an unwanted temperature distribution in the treatment temperature of the article W being treated results in difficulty in giving the desired physical properties to the article being treated.

In conventional heat treatment apparatus, an arrangement is also known like that of FIG. 11, for example, in which there is a first lamp unit 72 within a lamp housing 71 that comprises an array of multiple double-ended lamps 73 that are U-shaped so they are both parallel and perpendicular to the surface of the figure, with power supplies that feed the filaments 75 fitted in both ends of the bulbs, and below the first lamp unit 72 a second lamp unit 76 that comprises an array of multiple double-ended lamps 77 with a straight line shape running along the surface of the Figure and perpendicular to the surface of the figure, with power supplies that feed the filament attached to both ends of the bulbs. A semiconductor wafer or other article W to be treated placed on a support ring 78 that is positioned below the second lamp unit 76 and heated (see, Japanese Pre-grant Patent Publication 2002-203804).

In this heat treatment apparatus 70, in order to raise the temperature of the portion of the article W to be treated that is in contact with the support ring 78 on which the article W to be treated is placed, which tends to have a lower temperature than other portions, there is a mechanism to control the U-shaped tubes belonging to the first lamp unit 72 positioned over the contact portion, by increasing their power.

In this heat treatment apparatus 70, first the regions to be heated in the semiconductor wafer that is the article W to be treated are divided into multiple concentric zones with central symmetry, the light-irradiation distributions of the lamps to the first lamp unit 72 and the second lamp unit 76 are combined, a synthesized light-irradiation distribution pattern that has central symmetry with respect to the center of the semiconductor wafer corresponding to the zones into which the wafer is divided is formed, and in order to control the effect of scattering in the intensity of light from the lamps, the semiconductor wafer is rotated as heat treatment is applied in response to temperature changes in the individual zones.

It becomes possible, by means of this heat treatment apparatus 70 to individually heat the concentric zones on the article W to be treated and thereby, it was said, to make the temperature state of the article W to be treated uniform.

Nevertheless, in the event that the special regions mentioned above do not have central symmetry with respect to the center of the semiconductor wafer, it is not possible to solve the problem described above properly because heat treatment is done by rotating the semiconductor wafer.

Moreover, it is thought that the following problems could occur if this heat treatment apparatus 70 were actually used. Specifically, a U-shaped lamp comprises a horizontal portion 74B and a pair of vertical portions 74A, but because only the horizontal portion 74B where the filament 75 is located contributes to light emission, the individual lamps are separated by space to a degree that cannot be ignored, and so it is conceivable that temperature distributions will occur in areas beneath the spaces.

That is, even though the illumination-intensity distribution of the first lamp unit 72 is combined with that of the second lamp unit 76 to form a synthesized illumination intensity distribution with central symmetry on the semiconductor wafer, the illumination intensity beneath the spaces mentioned above will change (drop) rapidly, and so even though heating is performed in response to the temperature changes in each zone, it will conceivably be relatively difficult to reduce the temperature distribution that occurs in the vicinities beneath the spaces.

Furthermore, with regard to this sort of heat treatment apparatus 70, there has been a trend in recent years to reduce space (primarily in the height direction) for laying out the lamp units as much as possible, and so, if U-shaped lamps are used, space will be needed for the vertical portions of the lamps; this is not desirable from the perspective of space reduction.

In view of the above noted circumstances, the present inventors proposed a filament lamp, to be used as the light source of light irradiation type heat treatment apparatus with the following construction (see, Japanese Pre-grant Patent Publication 2006-279008). FIG. 12 is an explanatory perspective view that schematically shows the construction of one example of such a conventional filament lamp.

This filament lamp 80 has a straight-line bulb 81 that is hermetically sealed at both ends, and within the bulb 81 are multiple (two are shown in FIG. 12) filament assemblies 83A, 83B, comprising coiled filaments and leads that supply power to the filaments, that are sequentially arranged so that the filaments extend in the axial direction of the bulb 81.

In one filament assembly 83A, an end of a lead 86A that is connected to one end of the filament 84A is threaded through the through hole 92A formed in an insulator 91 made of quartz glass, for example, that is set between the filaments 84A, 84B and is electrically connected to an external lead 88A that projects outward from one hermetically sealed portion 82A by way of a metal foil 87A embedded within the hermetically sealed portion 82A at one end of the bulb 81A, and another lead 85A connected to the other end of the filament 84A in the filament assembly 83A is electrically connected to an external lead 88D by way of a metal foil 87D embedded within the hermetically sealed portion 82B at the other end of the bulb 81. There is an insulating tube 90B on the portion of the lead 85B that is opposite the filament 84A of the other filament assembly 83A.

A power supply 93A is connected to one filament assembly 83A by way of the external leads 88A, 88D, and another power supply 93B is connected to the other filament assembly 83B by way of the external leads 88B, 88C, by which means power can be supplied individually to the filaments 84A, 84B of the filament assemblies 83A, 84A.

Further, 89 is a circular anchor set along the axial direction of the bulb 81 in a position between the inner wall of the bulb 81 and the insulating tubes 90A, 90B; each filament 84A, 84B is supported by perhaps three anchors 89 so that it does not contact the bulb 89.

This filament lamp 80 has multiple filaments 84A, 84B within the bulb 81 and is constituted to provide individual control of the light emitted by each filament, so that if it is used as a light source for heating in light irradiation type heat treatment apparatus, it is possible to arrange filaments with higher precision with respect to the regions to be irradiated on the article to be treated that was possible using conventional filament lamps having a single filament in the bulb, by aligning the filaments in parallel rows.

Accordingly, by means of such light irradiation type heat treatment apparatus, it is possible to supply power individually to the multiple filaments 84A, 84B and to individually control the light emitted by each filament 84A, 84B. Thus, it is possible to irradiate with the desired irradiation distribution according to the characteristics of the article to be treated even when the distribution of localized temperature variations on the article to receive heat treatment is non-symmetrical with respect to the article to be treated. As a result, the article to be treated can be heated evenly and an even temperature distribution can be achieved across the entire irradiated surface of the article to be treated.

Furthermore, when compared with the heat treatment apparatus 70 that has U-shaped lamps described above, these filament lamps can have a straight-line shape and so do not require space corresponding to the vertical portion of U-shaped lamps. As a result, it is possible to reduce the size of the heat treatment apparatus.

SUMMARY OF THE INVENTION

In view of the foregoing, it is an object of the present invention to provide a filament lamp that is capable of feeding high power to the filament and of reliably obtaining the desired light-irradiation distribution, as well as a light irradiation type heat treatment apparatus that does not create non-uniformity in the light-irradiation distribution on the article to be treated or in the heat treatment of the article to be treated.

This object is achieved in accordance with the invention by the filament lamp having multiple filament assemblies, each of which comprises a coiled filament and its respective leads, in a sequential arrangement within a tubular bulb, which is formed with a hermetically sealed portion on at least one end, and parallel to the axis of the bulb, and is constituted so that power can be supplied to each filament independently. In a plane perpendicular to a filament, the leads associated with the other filaments are positioned in regions other than the region that includes at least that filament, enclosed by the tube wall of the bulb and two tangents that are perpendicular to that filament. The light irradiation type the heat treatment apparatus in accordance with the invention uses this filament lamp.

A number of filament lamps were produced in accordance with the construction shown in FIG. 12 (the construction shown in FIG. 1 of JP-A-2006-279008), a number of equipment sets having the same specifications as the heat treatment apparatus in which those lamps are mounted were produced, and heat treatment of articles to be treated was carried out by operating the various sets of heat treatment apparatus under the same working conditions. In doing this, it was found that, for each of the articles that were heat treated with the various sets of heat treatment apparatus, there was a lack of uniformity in regard to the desired physical properties and speed of temperature rise. It became clear that they were not constituted stably as heat treatment apparatus having the desired characteristics.

In this case, "same specifications" means that in each of light irradiation type heat treatment apparatus, the number of filament assemblies placed in the filament lamps and the number of filament lamps placed in the lamp units were the same; the method of layout of filament lamps in the lamp units in the light irradiation type heat treatment apparatus sets having the same specifications was the same.

Further, "same operating conditions" means that the power supplied to each filament lamp located in the lamp units was the same, and that the atmospheres (the variety of gas, the gas pressure, and so on) in which the articles to be treated were placed were the same in each set of light irradiation type heat treatment apparatus.

In other words, in light irradiation type heat treatment apparatus in which the filament lamps shown in FIG. 12 were mounted, it was not possible to achieve the desired distribution of irradiation intensity on the article to be treated by controlling individually the power supplied to each filament, as stated above. Accordingly, when sets of light irradiation type heat treatment apparatus having the same specifications are operated under the same operating conditions, in theory, it is thought that heat treatment would be carried out so that each article W to be treated would experience the same irradiation intensity distribution and the same temperature rise speed (degree of temperature change).

In reality, scattering of the irradiation intensity distribution on the article to be treated occurred in each set of heat treatment apparatus, and it became clear that differences occurred in temperature-rise characteristics, and specifically, that the temperature-rise speed was sometimes as much as 30% slower than other times.

This sort of problem was particularly obvious in light irradiation type heat treatment apparatus that tried to achieve highly precise control of temperatures on the article to be treated by mounting filament lamps that had multiple filament assemblies within the bulbs. The reason for that was confirmed to be the fact that non-uniformity of lead position arose from machining and assembly errors during production.

This invention is based on the situation described above; basically it allows large amounts of power to be supplied to the filaments. Its purpose is to provide a filament lamp that can reliably obtain desired light-irradiation properties and that can stably yield products with given properties.

Further, another purpose of this invention is to provide light irradiation type heat treatment apparatus that can stably yield products with given properties without non-uniform irradiation intensity distributions on the articles to be treated or non-uniform heat treatment of the articles to be treated.

The filament lamp of this invention has multiple filament assemblies, each comprising a coiled filament and its respective leads, in a sequential arrangement within a tubular bulb, which is formed with a hermetically sealed portion on at least one end, and parallel to the axial direction of the bulb, and is constituted so that power can be supplied to each filament independently, in which in a plane perpendicular to a filament, the leads associated with the other filaments are positioned in regions other than the region that includes at least that filament, enclosed by the tube wall of the bulb and two tangents that are perpendicular to each other and run along the outer circumference of the coiled filament, which can usually be described to approximately correspond to a cylinder jacket. That is, the outer diameter of the coiled filament then corresponds to the outer diameter of this cylinder jacket.

The filament lamp of this invention can have a construction in which (1) there are four or more filament assemblies, and (2) the coil diameter of the filament and the outer diameter of the lead are set so that, in a plane perpendicular to the axial direction of the bulb, the angle formed by tangents common to a filament and leads associated with filaments other than the filament in question will be in the range form 10° to 60°, and specifically, a construction in which the outer diameter of a lead is from 0.15 mm to 1 mm.

The filament lamp of this invention can have a construction in which the shape of the bulb is square in a cross-section cut in a plane perpendicular to the tube axis.

Moreover, it is preferable that the filament lamp of this invention have a construction in which a rod-shaped sealing insulator is located in the hermetically sealed portion, and multiple conductive components are arranged on the periphery of the sealing insulator at a distance from one another, and the conductive components are sealed between the hermetically sealed portion of the bulb and the sealing insulator.

The light irradiation type heat treatment apparatus has a light source that uses filament lamps as described above, each filament lamp being placed so that a region in which no leads are located is positioned facing the article to be treated.

The light irradiation-type heat treatment apparatus can have a construction in which the light source comprises lamp units in which multiple filament lamps are arrayed in parallel.

In light irradiation-type heat treatment apparatus having such a construction, it is preferable that the ratio Lp/L between the center-to-center distance Lp of adjacent lamps that constitute the lamp unit and the distance L from the central axes of the filament lamps to the article to be treated have a value no greater than 1.5.

EFFECT OF THE INVENTION

By means of the filament lamp of this invention, even if there is a lack of uniformity in the positioning of leads caused by machining or assembly errors during manufacture, the leads associated with filaments other than a given filament are all positioned in a specified region so that there will be a region where the light irradiated from the given filament can be received effectively without being blocked by the leads of the other filaments, and so it can be reliably constituted as something having the desired irradiation characteristics.

Further, by means of the filament lamp of this invention, it is possible to obtain the desired effect described above with the construction in which there are at least four or more filament assemblies per lamp and with the construction in which leads are used having outer diameters fulfilling the prescribed relationship to the size of the coil diameter of the filament, and so by independently controlling the state of illumination of the multiple filaments it is possible to obtain the desired irradiation-intensity distribution and to reliable obtain lamps of a construction that allows investment of a large amount of power in the filaments.

Moreover, if the shape of the bulb of the filament lamp is square in a cross-section cut in a plane perpendicular to the tube axis, a number of leads can be located within the bulb, by which means the installation of a number of filament assemblies is facilitated and it becomes possible, in the event that the filament lamp is used as a light source in light irradiation type heat treatment apparatus, to reliably and easily place and fix the filament lamps in the desired configuration.

Moreover, by using a sealing insulator to form the hermetically sealed portion, it is possible to place a number of pieces of electro-conductive material around the outside surface of the sealing insulator with no mutual contact between them, and so, even in the case of filament lamps having numerous filament assemblies, to allow highly precise temperature control with respect to articles to be treated having complex physical characteristics, it is possible to form a power-feed structure in which each filament assembly is independent without enlarging the hermetic seal portion.

By means of the light irradiation type heat treatment apparatus of this invention, there is a light source that uses filament lamps as described above and each filament lamp is placed so that a region in which no leads are located is positioned facing the article to be treated. By this means, the light from the filament lamps can illuminate efficiently, and so it is possible to stably yield products having given properties without creating non-uniformity in the light-irradiation distribution on the article to be treated or in the heat treatment of the article to be treated.

BRIEF DESCRIPTION OF THE DRAWINGS

FIG. 2 is a cross-sectional view showing a cross section in a plane perpendicular to the axial direction of the filament lamp shown in FIG. 1.

FIG. 3 is explanatory view showing the relationship between the size of the coil diameter of the filament and the size of the external diameter of the lead.

FIG. 7 is cross-sectional view showing the relationship between the pitch of the placement of lamps in the lamp unit and the distance to the article to be treated.

FIG. 8 is a plan view showing, together with the article to be treated, an example of the array of filament lamps that makes up the lamp units in another example of the construction of the light irradiation type heat treatment apparatus of this invention.

FIG. 9 is a front cross-sectional view schematically showing the construction of an example of conventional light irradiation type heat treatment apparatus.

DETAILED DESCRIPTION OF THE INVENTION

Figure 1:
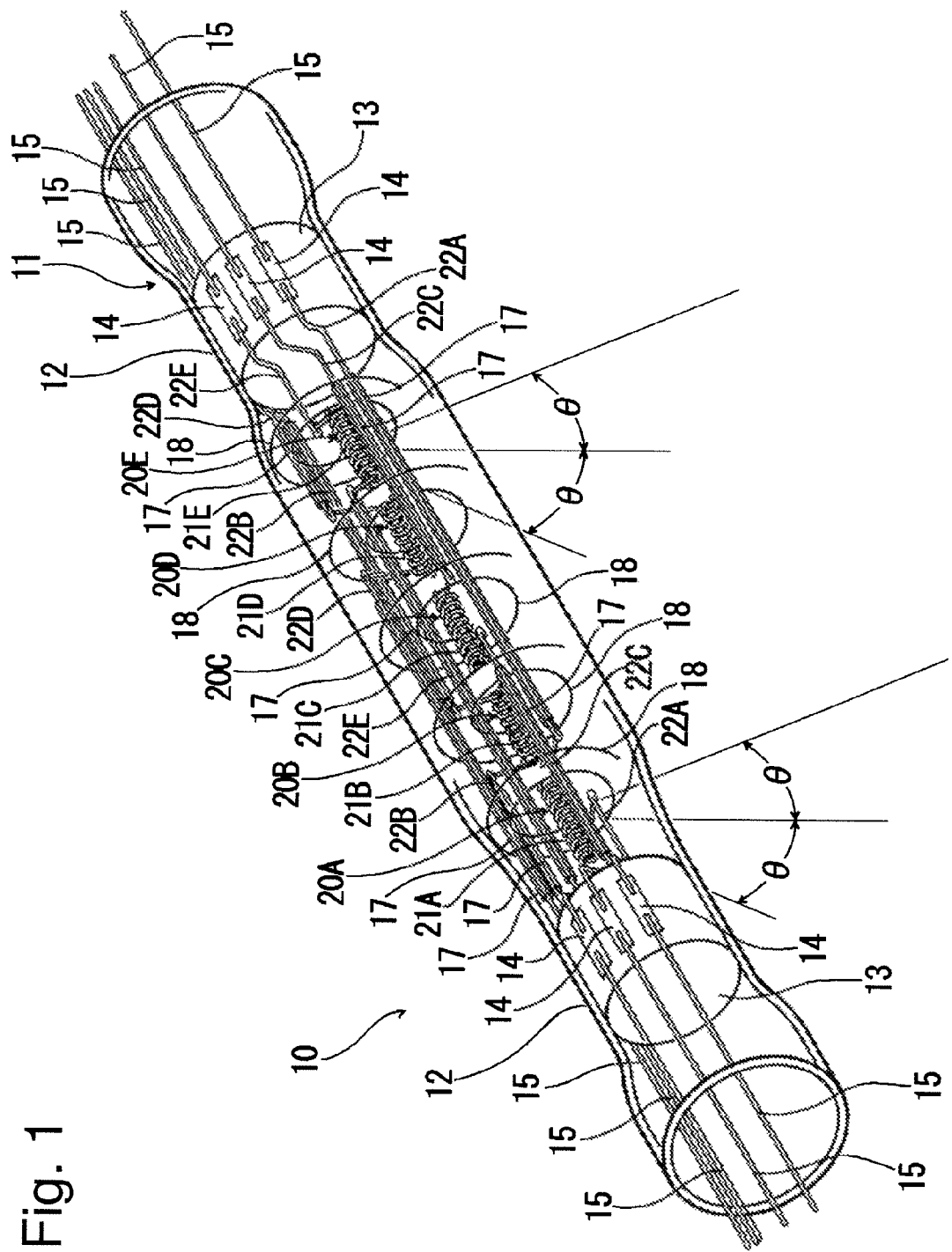
FIG. 1 is a perspective view showing the construction of one example of the filament lamp of this invention.

FIG. 1 is a perspective view showing one example of the filament lamp 10 of this invention that has a tubular, for example, linear, bulb 11 made of a light transparent material, such as quartz glass, and formed with hermetic seal portions at both ends. Within this bulb 11 are multiple, for example, five, filament assemblies 20A to 20E that comprise coiled filaments 21A to 21E and power-feed leads 22A to 22E that are connected to both ends of the filaments 21A to 21E. These filament assemblies 20A to 20E are sequentially arranged to extend along the tube axis of the bulb 11, in which a halogen gas is sealed. The number of filament assemblies here is not really fixed, and can be changed as is appropriate to the dimensions of the article to be treated and its physical properties.

The hermetically sealed portion 12 of the filament lamp 10 are formed by inserting a cylindrical sealing insulator 13, perhaps made of quartz glass, into the structural material of the bulb and, when it is in place, heating the outside surface of the structural material of the bulb with a burner or by other means to form a shrink-seal structure.

With perhaps five metal foils 14, depending on the number of filament assemblies positioned at roughly equal intervals in the peripheral direction on the outer surface of the sealing insulator 13 and extending in the axial direction of the tube, the inner surface of the bulb 11 and the outer surface of the sealing insulator 13 are hermetically sealed with the metal foils 14 in between. The individual metal foils 14 used are shorter in length than the length of the sealing insulator 13, in order to avoid folding the foil.

Each of the leads 22A to 22E of the filament assemblies 20A to 20E are electrically connected to an external lead 15, which projects and extends outward in the direction of the tube axis of the bulb 11, by way of the corresponding metal foil 14 within the hermetically sealed portion 12.

Then, the external leads 15 associated with each filament assembly 20A to 20E are connected to power supplies (not illustrated); by supplying power independently to the filaments 21A to 21E of the filament assemblies 20A to 20E, it is possible to apply individual lighting control of the filaments 21A to 21E.

By placing the sealing insulator 13 inside the bulb 11 and forming the hermetically sealed portion 12, it is possible to use the periphery of the cylindrical sealing insulator 13 to position the multiple metal foils 14 without any contact between them, and so, even with a filament lamp 10 equipped with multiple filament assemblies, it is possible to reliably form an independent power-feed structure for each filament assembly 20A to 20E without enlarging the hermetically sealed portion 12. In comparison to formation of a flat hermetically sealed portion by the pinch-seal method, in particular, it is possible to reduce the size of the hermetically sealed portion 12 even when multiple metal foils 14 are in place; this is desirable from the perspective of saving space. Now, rather than spacing the metal foils evenly, if space allows it is possible to adjust the spacing to correspond to the positions of leads that are placed to allow efficient illumination by the light from the filament lamp.

In this filament lamp 10, there is an insulating tube 17 made of an insulating material such as quartz glass at the location where the lead 22A of the filament assembly 20A, for example, faces the filaments 21B to 21E and leads 22B to 22E of the other filament assemblies 20B to 20E. The other filament assemblies 20B to 20E have the same construction.

Installing the insulating tubes 17 makes it possible to reliably prevent short circuits due to contact between leads and filaments that face those filaments in the diametric direction of the bulb 11, as well as short circuits due to contact between individual leads that face each other in the diametric direction of the bulb 11.

Further, so that there will be no contact between the filament assemblies 20A to 20E and the inner wall of the bulb 11, each is supported within the bulb 11 by a circular anchor 18 that is fitted so that it is between the inner wall of the bulb 11 and the insulating tube 17. In this embodiment, the anchor 18 is fixed to the filament and there is one anchor 18 for each of the filament assemblies 20A to 20E.

By means of this construction, it is possible to prevent the malfunction of a loss of transparency of the bulb 11 that would result from contact with the inner wall of the bulb 11 by a filament 21A to 21E, which reaches a high temperature when lit; it is also possible to reliably locate the leads 22A to 22E in desired positions in the interior space of the bulb 11.

With respect to a given filament in the filament lamp 10, all the leads of filaments, other than the given filament, are positioned in a specified region within the bulb.

To explain more concretely, in a cross section in a plane perpendicular to the center line of the filament 21E, for example, as shown in FIG. 2, at least the filament 21E is in a region enclosed by two tangents TA, TB, which are perpendicular to each other, and the inner wall of the bulb 11 (called "the effective light-production region EA1" hereafter) and the leads 22A to 22D associated with the filaments 21A to 21D, other than the given filament 21E, are all positioned in regions other than that region. The effective light-production region EA1 corresponds to the first quadrant defined in the claims. Each of the respective filaments has its first quadrant, and the leads of those filaments other than the given filament are positioned outside this first quadrant.

In this embodiment, the leads 22A to 22D associated with the other filaments 21A to 21D are located symmetrically with respect to the filament 21E, and there are no leads in the region EA2 that is opposite the effective light-production region EA1 (in FIG. 2 the region EA2 is located above the filament 21A).

The other filaments 21A to 21D have the same construction.

The effective light-production region EA1 is defined as described above for the following reasons.

In the event that light is incident upon the article W to be treated at an angle, the illuminance I is expressed by the formula $I=I_0 \cos \theta$, where $I_0$ is the illuminance when the incident light is vertical (angle of incidence is 0°) and the angle of incidence of the light is $\theta$; the greater the angle of incidence $\theta$ is, the smaller the illuminance will be.

In order to prevent uneven temperatures in heat treatment of an article W to be treated, it is necessary that the degree of decline of the illuminance from the peak value be no more than a given proportion; the usable range of the light's angle of incidence $\theta$ is set on the basis of that.

In the case of heat treatment of a semiconductor wafer, for example, even in the processes, such as the donor killer process, where the required precision of temperature is most lenient, the maximum degree of decline of the illuminance from the peak value is about 30% (20% when converted to the degree of decline of the temperature from the peak temperature); the corresponding threshold value for the angle of incidence $\theta$ of the light will be 45°, for example. Now, the reason that the degree of decline of temperature is more lenient than the degree of decline of illuminance is that semiconductor wafers have a high index of thermal conductivity, and so the degree of decline is buffered by the diffusion of heat within the semiconductor wafer.

In practical terms, therefore, the threshold value of the angle of incidence $\theta$ in FIG. 2 is set at 45°, for example. It is advantageous that leads be located in regions outside the region of this angular range, that is, the region enclosed by two tangents TA, TB, which are perpendicular to each other, and the inner wall of the bulb 11; that is because locating leads in regions outside the region of this angular range makes it possible to use the light radiated by the filament as effectively and uniformly as possible, without local drops occurring.

In the embodiment of the filament lamp 10 described above, the bulb 11 has an outside diameter of 12 to 16 mm, for example, and an inside diameter of perhaps 10 mm to 14 mm; the filaments 21A to 21E have an outside diameter (coil diameter) of from 2 mm to 5 mm (the diameter of the wire that makes up the filaments 21A to 21E is φ0.1 mm to 0.5 mm), perhaps 2.9 mm, and a length of perhaps 30 mm to 300 mm; the leads 22A to 22E have an outside diameter of φ0.15 mm to 1 mm), perhaps φ0.8 mm; and the maximum rated current value per lead is 2.5 A to 20 A.

Using a filament lamp 10 with the construction described above, with respect to a given filament, all the leads of filaments other than the given filament are positioned in a specified region; therefore, an effective light-production region EA1 is formed so that the light radiated directly from the filament is produced effectively without being blocked by the leads and insulating tubes 17 associated with the other filaments, and so it can be reliably constituted as one having the desired light-irradiation properties.

In the filament lamp 10 described above, multiple power-feed leads 22A to 22E are placed in the bulb so as to extend along the tube roughly parallel to the filaments 21A to 21E that extend along the tube axis of the bulb 11. Because of this, it is very advantageous that (1) the number of filament assemblies be four or greater, and (2) the proportion between the outer diameter of the lead and the outer diameter of the filament be relatively large so that the angle α between the tangents common to the filament and the lead is in the range 10°<α<60°.

A concrete explanation of point (2) above is made with reference to FIG. 3. In recent years, there have been demands to increase the power of filament lamps in order to rapidly heat semiconductor wafers or other articles to be treated; that is, it has become desirable to increase the electrical power per unit length invested in filament lamps above the conventional levels. In pursuance of such demands it is necessary that a large current—2.5 A to 20 A, for example—flow in the filament, and so the wire diameter $D_L$ of the leads 22 is set so that the leads do not generate high temperatures and melt through when lit. In the event that the rated current value is 2.5 A, for example, leads 22 with a wire diameter $D_L$ of φ0.15 mm, for example, are used, and in the event that the rated current value is 20 A, for example, leads 22 with a wire diameter $D_L$ of φ1 mm are used. Now, sometimes multiple filaments with mutually differing current values are used in filament lamps, but more frequently, there is unified use of the lead diameter for the greatest current capacity needed in order to avoid complicating the management of production processes.

With regard to the outside coil diameter $D_F$ of the filaments 21, on the other hand, the length of the filaments 21 in the axial direction is set to fit a given length relative to the dimensions of the region to be irradiated while assuring that the total length of the wire making up a filament 21 can handle the high power advantage. For example, the outside coil diameter $D_F$ is from 2 mm to 5 mm.

In addition, in order to increase the illuminance on the irradiated surface of the article to be treated, it has become necessary to line up filament lamps more densely at the same time, the power investment per filament is increased, and there have been demands to reduce the outside diameter of the bulb 11 as much as possible. As a result, dimensional constraints have been imposed on the separation of the filaments 21 and leads 22 installed in the bulb 11. For example, the center-to-center separation $L_C$ between the filaments 21 and the leads 22 must be in the range of about 6 mm.

As stated above, in the filament lamp 10 with the construction described above, the angle $\alpha$ between the tangents CT1, CT2 common to a filament 21 and a lead is to be in the range $10° < \alpha < 60°$. If the lead 22 is simply placed inside the bulb 11, there is liable to be the problem that the illuminance is reduced by the lead 22 casting a shadow, but the lead positioning structure of this invention can reliably prevent such a problem from arising.

Now with regard to the number of filament assemblies, the more filament assemblies there are, the more precisely the distribution of illuminance on the article to be treated can be controlled, and so in the case of processes that demand highly precise control of temperature, such as the oxygenation process or the implanted ion activation process, it is preferable to have five or more filament assemblies, and seven to nine are preferable in the case of processing large-diameter semiconductor wafers of $\phi 300$ mm or more. The more filament assemblies there are, the more leads there will be, and so it becomes more and more important to place the leads in appropriate positions.

One embodiment of the filament lamp of this invention is explained above, but this invention is not limited to that embodiment; and various changes can be made to it.

Figure 4:
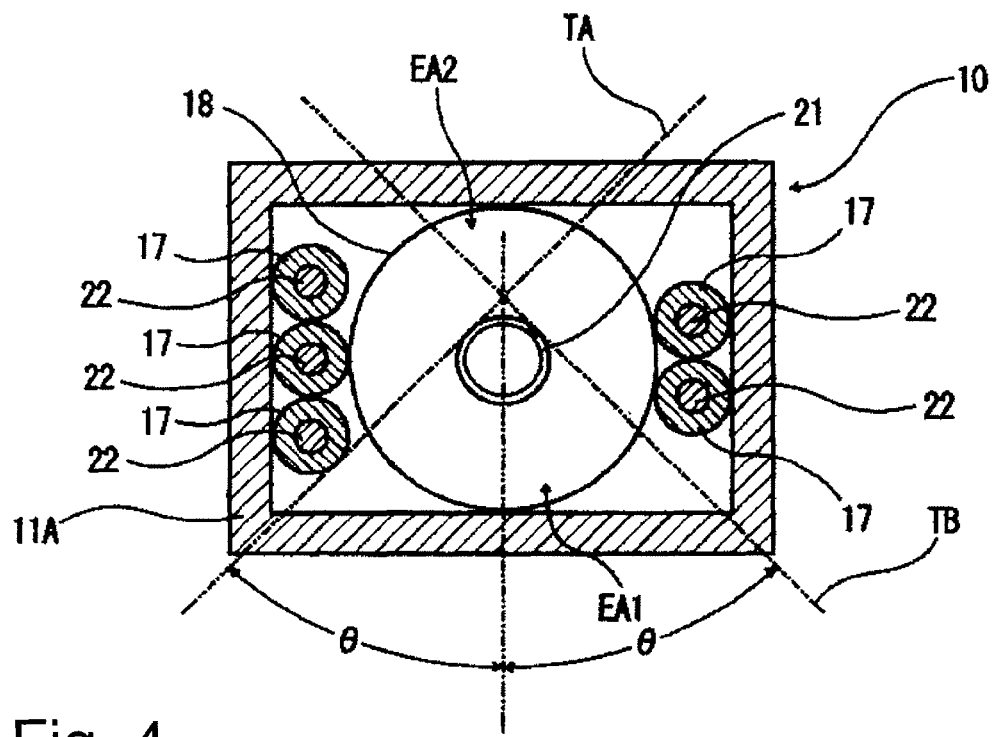
FIG. 4 is cross-sectional view in a plane perpendicular to the tube axis, schematically showing another example of a filament lamp of this invention.

FIG. 4 schematically shows another embodiment of the filament lamp of this invention in a cross section taken at a plane perpendicular to the tube axis of the bulb.

Other than having a rectangular bulb 11A that has a square cross section when taken in a plane perpendicular to the tube axis, this filament lamp 10 has the same construction as that of the embodiment described above. There are no leads 22 associated with other filaments in the effective light-production region EA1 or the opposite region EA2 of a given filament; the leads 22 are located along the side walls on both sides of the bulb 11A. The adjacent insulating tubes 17, here, can be in close contact. Because the bulb 11A is square or rectangular in cross section, the leads 22 associated with the other filaments can be placed in appropriate positions by using the two inner side walls of the bulb 11A, and so multiple leads 22 can be placed even more easily and even more reliably than in a cylindrical bulb having the same outside diameter as this rectangular tube. Therefore, it is possible to profitably manufacture filament lamps 10 that can realize highly precise control of temperatures on the article to be treated.

Because the cross-sectional shape of the bulb 11A in the filament lamp 10 of this construction is square, it is possible, to reliably and easily perform the operation of fixing the filament lamp 10 so that the region where no leads are located is facing the article to be treated, when filament lamps are placed in the lamp unit accommodation space of the light irradiation type heat treatment apparatus described hereafter.

This invention is not limited to filament lamps in which the shape of the bulb is straight; it can also be applied to filament lamps in which the bulb is, for example, spiral-shaped, circular (ring-shaped), or some other shape.

As stated above, the filament lamp of this invention is constituted so that it is possible to deliver a large amount of power to the filament assemblies because power can be fed independently to multiple filament assemblies within the bulb, and the light that is radiated in a given direction from each filament can be produced at or above a given level of illuminance because a special lead placement structure has been adopted. Thus, the inventive lamp is very useful as a heating light source in light irradiation type heat treatment apparatus. The light irradiation type heat treatment apparatus of this invention is explained below.

Light Irradiation Type Heat Treatment Apparatus

Figure 6:
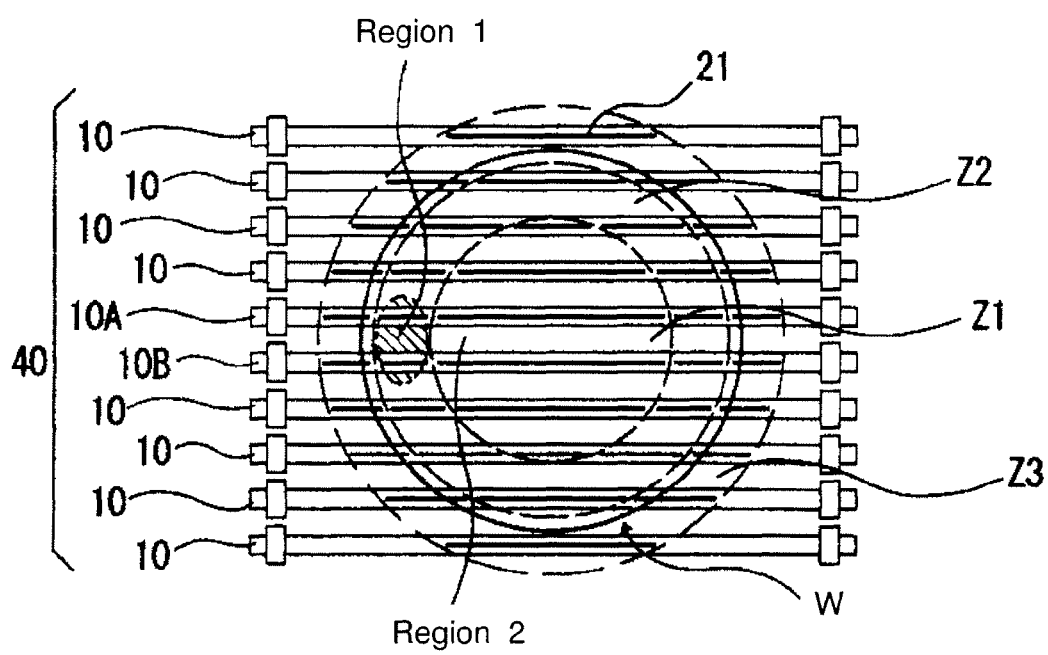
FIG. 6 is a plan view showing, together with the article to be treated, an example of the array of filament lamps that make up a lamp unit in the light irradiation type heat treatment apparatus shown in FIG. 5.
Figure 5:
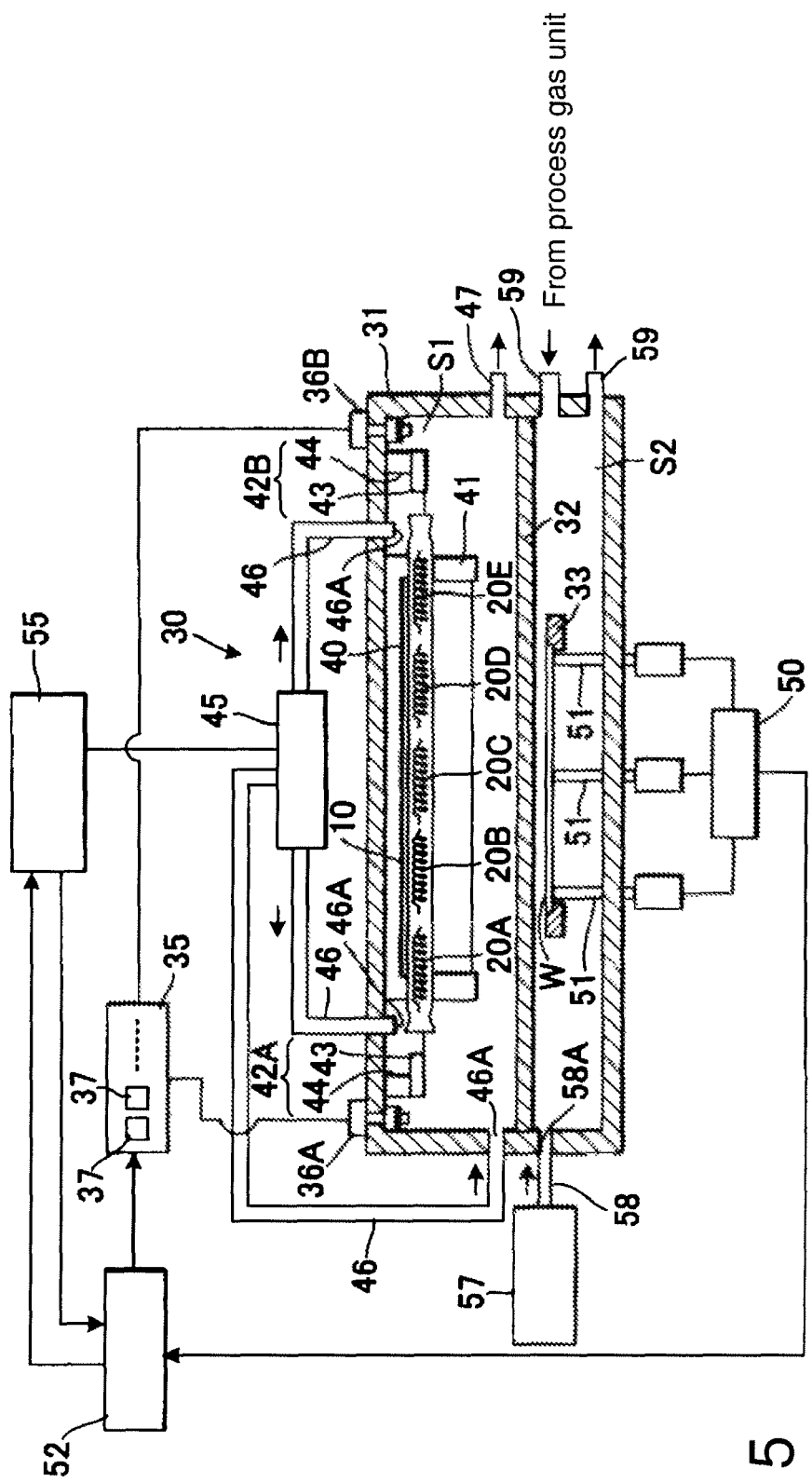
FIG. 5 is cross-sectional view schematically showing the construction of an example of the light irradiation type heat treatment apparatus of this invention.
Figure 10:
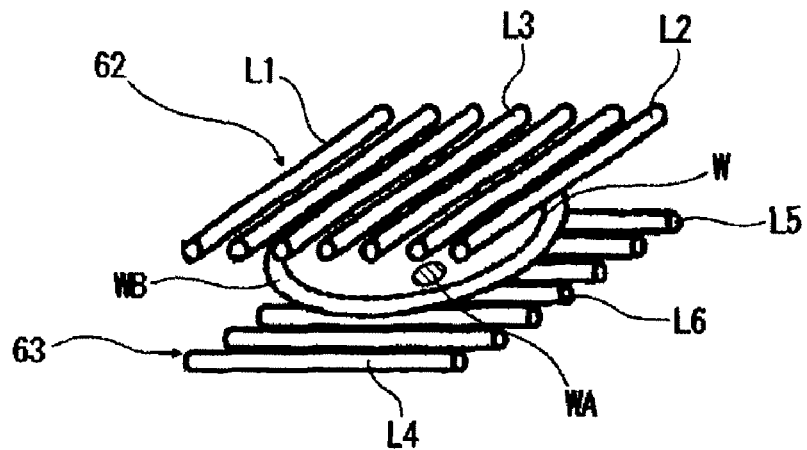
FIG. 10 is a perspective view showing an example of the lamp array that constitutes the light source of the heat treatment apparatus shown in FIG. 9.
Figure 11:
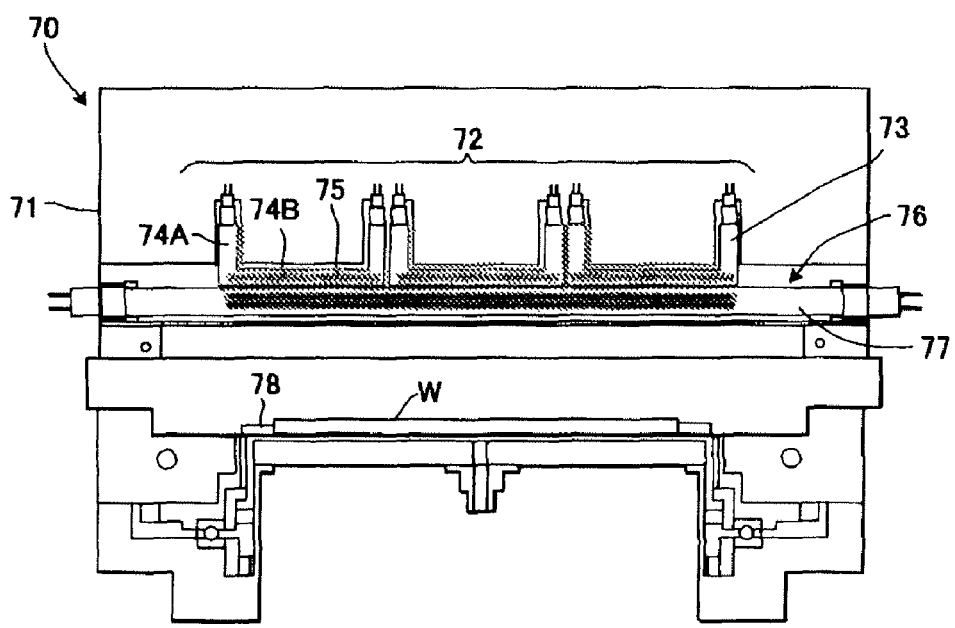
FIG. 11 is a front cross-sectional view schematically showing the construction of another example of a conventional light irradiation type heat treatment apparatus.
Figure 12:
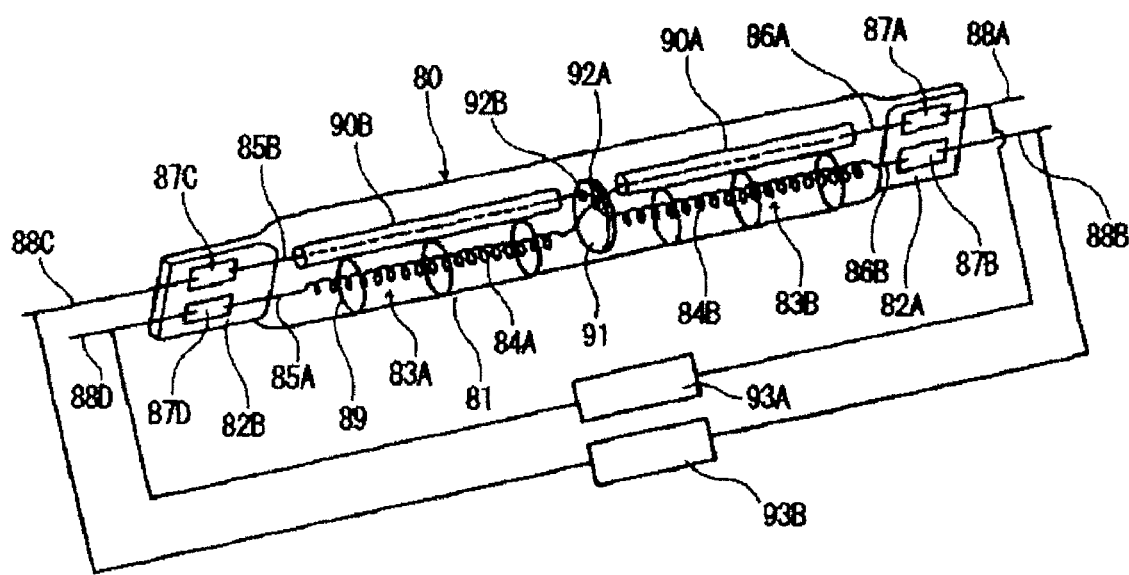
FIG. 12 is a perspective view schematically showing the construction of an example of a conventional filament lamp.

FIG. 5 is a schematic cross-sectional view showing the construction of one example of the light irradiation type heat treatment apparatus of this invention, and FIG. 6 is a plan view showing, together with the article to be treated, an example of the array of filament lamps that make up a lamp unit in the light irradiation type heat treatment apparatus shown in FIG. 5.

This light irradiation type heat treatment apparatus 30 has a chamber 31 of which the interior space is divided vertically by an aperture plate made of quartz glass, for example, into a lamp unit accommodation space S1 and a heat treatment space S2. A lamp unit 40 that comprises multiple filament lamps is placed in the lamp unit accommodation space S1, along with a reflecting mirror 41 that reflects light irradiated upward from the lamp unit 40 back toward the article W to be treated. These make up the light source.

The lamp unit 40 has perhaps ten of the filament lamps 10 described above positioned with their central axes all in the same level plane and with their effective light production regions EA1 directed toward the article W to be treated. In other words, referring to FIG. 2, they are lined up with the straight line C that joins the intersection of the two tangents TA, TB with the center point of the filament perpendicular to the article W to be treated and separated from it by the specified gap.

With regard to the light emitting region of the lamp unit 40 as a whole, the number of filaments 21 located within the bulb 11 can be adjusted to correspond to at least the length of the region on the article W to be treated that is crossed by each filament 21 (lengths are indicated by solid lines inside the filament lamps 10 in FIG. 6), or the length of each filament 21 can be adjusted with the same number of filaments 21 in each lamp. Or the region can be set by adjusting both the number and lengths of filaments 21.

For example, when the article W to be treated is a round semiconductor wafer, the surface of the semiconductor wafer can be divided into multiple concentric, circular regions Z1 to Z3 (the innermost region Z1 is round), and the desired illuminance distribution can be obtained by control of the lighting of the filaments 21 of each of the filament lamps 10 in accordance with the physical properties of the semiconductor wafer in each region Z1 to Z3.

The center to center distance (lamp placement pitch) $L_P$ between the adjacent filament lamps 10 that make up the lamp unit 40 should be set in relation to the distance L between the lamp central axis of a filament lamp 10 and the article W to be treated so that drops in illuminance—what is called "ripple"—in the distribution of illuminance on the article W to be treated will not occur or will be as slight as possible.

Concretely, in the case of the donor killer process or others where the required precision is relatively lenient, it is preferable that the $L_P/L$ value be 1.5 or less, and in the case of the annealing process or the oxide film formation process where a high degree of precision is required, it is preferable that the $L_P/L$ value be 1 or less.

By means of such a construction, it is possible to prevent the occurrence of non-uniform temperatures caused by ripple generation.

The reflecting mirror 41 is made of a base metal such as oxygen-free copper coated with gold and has a shape chosen from a portion of a circle, a portion of an ellipse, a portion of a parabola, a flat plate, and so on.

Each filament lamp 10 of the lamp unit 40 is supported by a pair of fixed stages 42A, 42B.

The fixed stage 42A, 42B comprises a conductive stage 43 made of a conductive material and a support stage 44 made of an insulating material such as ceramic; the support stages 44 are installed on the inner wall of the chamber 31 and support the conductive stages 43.

When n1 is the number of filament lamps 10 making up a lamp unit 40, m1 is the number of filament assemblies in one filament lamp, and power is fed independently to each of the filaments, n1×m1 pairs of fixed stages are required.

Pairs of power supply ports 36A, to which power feed wires from the power feed equipment 37 of the power source 35 are connected are installed in the chamber 31. The number of paired power supply port sets is set on the basis of the number of filament lamps 10, the number of filament assemblies in each filament lamp 10, and so on.

In this embodiment, a power supply port 36A is electrically connected to a fixed stage 42A and conductive stage 43 on one side, and the fixed stage 42A and conductive stage 43 are electrically connected to the external lead on one end of one filament in one filament lamp. The power supply port 36B is electrically connected to a fixed stage 42B and conductive stage 43 on the other side, and the fixed stage 42B and conductive stage 43 are electrically connected to the external lead on the other end of that filament.

By this means, the filament assembly 20A in one filament lamp 10 of the lamp unit 40 is electrically connected to the power-feed equipment 37 of the power source 35. The other filament assemblies 20B to 20E of that filament lamp 10 are similarly connected to their own power-feed equipment by other pairs of power-supply ports.

Then, each filament of the other filament lamps 10 that make up the lamp unit 40 is electrically connected to its corresponding power feed equipment in the same way. By means of this construction, it is possible to set the distribution of illuminance on the article W to be treated arbitrarily and with high precision, by selectively lighting the filaments of each filament lamp 10, or by controlling individually the amount of power fed to each filament assembly. Now, it is also possible to selectively control the lighting of only a single filament lamp in the lamp unit.

In the light irradiation type heat treatment apparatus 30 described above, light is produced by supplying power, controlled to the appropriate amount, from the power source 35 to each filament of each filament lamp 10 of the lamp unit 40, by which means the light radiated from each filament lamp 10 irradiates the article W to be treated installed in the heat treatment space S2 through the aperture plate 32, either directly through the effective light-production region EA1, or through the region EA2 that is opposite the effective light-production region EA1 after reflection by the reflecting mirror 41, and heat treatment of the article W to be treated is performed.

A cooling mechanism is installed in this light irradiation type heat treatment apparatus 30 to cool the filament lamps 10 during heat treatment of the article W to be treated.

Specifically, chilled air from the chilled air unit 45 installed outside the chamber 31 is introduced into the lamp unit accommodation space S1 by way of the chilled air supply nozzle 46 and the jet 46A, and the chilled air is blown onto the filament lamps 10 in the lamp unit 40. By this means, the bulb 11 of each filament lamp 10 is cooled, after which the chilled air that has been heated by heat exchange is exhausted to the outside from a chilled air exhaust port formed in the chamber 31.

Because the hermetically sealed portion 12 of each filament lamp 10 has low resistance to heat relative to other parts, it is desirable that the cooling mechanism be formed so that the jet 46A of the chilled air supply nozzle 46 is directed toward the hermetic seal portions 12 of the filament lamps 10, and that it be constituted so that the bulbs of the filaments have precedence in cooling.

Now, the flow of chilled air introduced into the lamp unit accommodation space S1 is set so that so that the filament lamps 10 will not instead be heated by chilled air that has been heated by means of heat exchange, and so that the reflecting mirror 41 will be cooled at the same time. Further, in the event of a construction in which the reflecting mirror 41 is water-cooled by a water cooling mechanism, illustration of which has been omitted, there is no need to set the flow of chilled air so that it cools the reflecting mirror 41 at the same time.

In this light irradiation type heat treatment apparatus 30, moreover, the jet 46A of the chilled air supply nozzle 46 is formed in the vicinity of the aperture plate 32 and is constituted so the aperture plate 32 is cooled by chilled air from the chilled air unit 45. This becomes a means of redundant temperature controllability for the article W to be treated which would be subject to unwanted heating by secondary radiation of heat from an aperture plate 32 that had accumulated heat re-radiated from the heat-treated article W (as in the case of "overshoot," where the temperature of the article to be treated rises above the set temperature), and makes it possible to reduce the non-uniformity of temperature caused by temperature variations in the accumulated heat of the aperture plate 32 itself, and to reliably prevent such problems as drops in the speed of temperature rise in the article W to be treated.

A treatment stage 33 to which the article W to be treated can be fixed is installed in the heat treatment space S2 in the chamber 31.

In the event that the article to be treated is a semiconductor wafer, for example, the treatment stage 33 is a thin, ring-shaped piece made of a metal with a high melting point, such as molybdenum, tungsten, or tantalum, a ceramic material, such as silicon carbide (SiC), or quartz or silicon (Si). It is preferable that the treatment stage 33, a guard ring structure in which a stepped portion is formed to support the semiconductor wafer inside the circular opening.

Because the treatment stage 33 itself is heated by the irradiated light, the outer edge of the semiconductor wafer that faces it is subjected to supplemental radiant heating; this makes up for the temperature drop in the peripheral area of the semiconductor wafer caused by heat re-radiation from the edge of the semiconductor wafer.

On the back side of the article W to be treated that is positioned on the treatment stage 33, there are a number of temperature measurement areas 51, which comprise thermocouples or radiant thermometers, placed in contact with or in the vicinity of the article W to be treated for the purpose of monitoring the temperature distribution of the article W; the temperature measurement areas 51 are connected to a thermometer 50. There are no particular limits on the number or placement of the temperature measurement areas 51; they can be decided upon in response to the dimensions of the article W to be treated.

The thermometer 50 has the functions of calculating the temperatures at the measurement points of the temperature measurement areas 51 on the basis of the temperature information monitored by the individual temperature measurement areas 51, and sending the calculated temperature information to the main controller 55 by way of the temperature controller 52.

The main controller 55 has the function of sending instructions to the temperature controller 52, on the basis of temperature information at the individual measurement points on the article W to be treated, to bring about a uniform distribution of temperatures at the prescribed temperatures on the article W to be treated.

The temperature controller 52 has the function of controlling, on the basis of instructions from the main controller 55, the amount of power fed from the power source 35 to the filaments of each filament lamp 10.

In the event that the temperature controller 52 sends the temperature information that, for example, the temperature at a certain measurement point is lower than the specified temperature, the main controller 55 will send the temperature controller 52 an instruction to increase the amount of power fed to the filament that irradiates that temperature measurement point so that the light radiated by that filament will increase. On the basis of the instruction received from the main controller 55, the temperature controller 52 will then increase the power supplied by the power source 35 to the power supply ports 36A, 36B that are connected to the filament in question.

Further, when the filament lamps 10 of the lamp unit 40 are lit, the main controller 55 sends instructions to the chilled air unit 45, and the chilled air unit 45 acts on those instructions to supply chilled air so the bulbs 11, the reflecting mirror 41, and the aperture plate 32 will not reach high temperatures.

Moreover, a process gas unit 57 is connected to this light irradiation type heat treatment apparatus 30 in order to introduce and exhaust process gases to and from the heat treatment space S2 in accordance with the type of heat treatment.

For example, when a heat oxidation process is performed, the process gas unit 57 is connected and oxygen gas is introduced to the heat treatment space S2, and then a purge gas (nitrogen gas, for example) is introduced and exhausted to purge the heat treatment space S2.

The process gases and purge gas from the process gas unit 57 are introduced into the heat treatment space S2 by way of a gas supply nozzle 58 and a jet 58A, and exhausted to the outside by way of an exhaust port 59.

The light irradiation type heat treatment apparatus constituted as described above basically performs the following actions.

The lamp unit 40 comprises a parallel array of multiple filament lamps 10, each of which has multiple filament assemblies within a bulb 11 extending in order along the tube axis, with power fed independently to each filament. This makes it possible to adjust the distribution of light intensity in two directions—the axial direction of the bulbs and the direction at a right angle to that—and so it is possible to set the illuminance distribution on the surface of the article W to be treated with high precision in two dimensions.

Because it is possible to set the illuminance on a special region that is limited to an area of a length which is smaller than the light emitting length of the filament lamp 10, it is possible to set the radiation intensity distribution to correspond to the particular properties of the special region and other regions. On the article W to be treated shown in FIG. 6, for example, if it is decided in advance that the temperature of the region (called "region 1") directly below filament lamps 10A, 10B in the circular zone Z2 would be lower than the temperature of other regions (called "region 2") on the article W to be treated, or that the degree of temperature rise in region 1 would be less than the degree of temperature rise in region 2, it is possible to adjust the temperatures to be uniform in region 1 and region 2 by increasing the amount of power fed to those filaments among the filaments of filament lamps 10A, 10B that correspond to region 1. It is possible, therefore, to perform heat treatment with a temperature distribution that is uniform all across the article W to be treated.

Further, the illuminance distribution on an article W to be treated that is separated from the lamp unit 40 by the specified distance can be set precisely and arbitrarily, and as a result, it is possible to set a illuminance distribution on the article W to be treated that is asymmetric with respect to the shape of the article W to be treated. Consequently, even in the event that the distribution of local temperature changes on the article W to be treated is asymmetrical with respect to the shape of the article W to be treated, the illuminance distribution on the article W to be treated can be set to that, and the article W to be treated can be heated to a uniform temperature distribution.

Moreover, the filaments 10 can be constituted so that there is very little separation between the filaments within the bulb 11, so that it is possible to minimize undesirable scattering in the distribution of illuminance on the article W to be treated.

Further, only a little layout space is needed for the lamp unit 40 in the vertical direction of the light irradiation type heat treatment apparatus 30, and so size reduction of the light irradiation type heat treatment apparatus 30 is possible.

Further, because the filament lamps 10 are placed within the effective light production regions EA1, which are formed by an absence of leads, directed toward the article W to be treated, the light from each filament lamp 10 can be irradiated efficiently, and so it is both possible to reliably obtain the effect described above and possible to stably obtain uniform performance, without the problems of non-uniform temperature rise speed or illuminance distribution on the article to be treated, whether or not sets of light irradiation type heat treatment apparatus having the same specifications are operated under the same operating conditions.

In the light irradiation type heat treatment apparatus of this invention, the light source can also be constituted with multiple lamp units, each comprising multiple filament lamps.

To explain such a construction more concretely, a first lamp unit 40A and a second lamp unit 40B can be lined up one above the other and both above the article W to be treated (within the lamp unit accommodation space), as shown in FIG. 8.

The first lamp unit 40A and the second lamp unit 40B each comprise multiple, perhaps ten, filament lamps 10, and each with the central axes of its lamps in a single plane and the effective light-production regions facing the article W to be treated, lined up parallel with a specified spacing, for example. The direction of the central lamp axes of the filament lamps 10 that make up the first lamp unit 40A intersects the direction of the central lamp axes of the filament lamps 10 that make up the second lamp unit 40B.

The effects described above can be obtained even more reliably by means of light irradiation type heat treatment apparatus having a light source with such a construction.

The light irradiation type heat treatment apparatus of this invention has been described in terms of using a lamp unit that comprises multiple special filaments as a light source for heating, but they need not constitute a lamp unit; a light source comprising a single filament lamp is also possible.

Additionally, the articles to be heat treated in the light irradiation type heat treatment apparatus of this invention are not limited to semiconductor wafers; examples of other possibilities include polycrystalline silicon substrates, glass substrates, or ceramic substrates for solar panels, glass substrates for liquid crystal display elements, and so on.

In particular, quadrilateral substrates are much used as substrates for various materials used in solar panels, and light irradiation type heat treatment apparatus used for heat treatment of this sort of article to be treated is often constituted to perform heat treatment by irradiating a band of light, with the quadrilateral substrates moving horizontally under a single filament lamp that is placed so that the tube axis extends in the direction perpendicular to the direction of substrate movement, or with multiple filament lamps lined up with their tube axes extending in the direction perpendicular to the direction of substrate movement. In such cases, use of a filament lamp of this invention having four or more filament assemblies makes it possible to adjust the illuminance distribution on the central area of the substrate (the center of the irradiation band) while compensating for the temperature drop at the two edges parallel to the direction of substrate movement (both ends of the irradiation band), and so it is possible to reliably control temperatures with higher precision.

What is claimed is:

1. A filament lamp, comprising:
a bulb which has a hermetically sealed portion on at least one end;
multiple filament assemblies, each filament assembly comprising a coiled filament and connected leads to supply power to that filament, within said bulb, the filament assemblies being sequentially arranged in the axial direction of the bulb, the leads of each filament assembly being electrically connected to respective multiple conductive parts set in the sealed portions, and power being independently suppliable to each of the filaments;
wherein a respective one of the coiled filaments is located in a respective first quadrant formed by intersecting planes that are perpendicular to each other and that are tangent to an outer coil diameter of the respective coiled filament; and
wherein the leads are positioned in quadrants other than the quadrant in which the coiled filament is located.

2. A filament lamp as described in claim 1, wherein there are coiled filament has at least four of said filament assemblies.

3. A filament lamp as described in claim 1, in which the coiled filament has an outer coil diameter in relation to an outer diameter of the leads such that a pair of lines that are tangent to both the filament and each of the leads associated with the filaments other than the said filament in a plane perpendicular to the axial direction of the bulb form an angle of from 10° to 60°.

4. A filament lamp as described in claim 3, wherein the outer diameter of each lead is in a range of from 0.15 mm to 1 mm.

5. A filament lamp as described in claim 1, wherein the bulb has a square cross-section in a plane perpendicular to said axial direction of the bulb.

6. A filament lamp as described in claim 1, wherein a rod-shaped sealing insulator is located in the hermetically sealed portion, multiple conductive components being arranged on the periphery of the sealing insulator at a distance from one another, and the conductive components being sealed between the hermetically sealed portion of the bulb and the sealing insulator.

7. Light irradiation type heat treatment apparatus having a light source comprising a plurality of filament lamps, each of which comprises:
a bulb which has a hermetically sealed portion on at least one end; multiple filament assemblies, each filament assembly comprising a coiled filament and connected leads to supply power to that filament, within said bulb, the filament assemblies being sequentially arranged in the axial direction of the bulb, the leads of each filament assembly being electrically connected to respective multiple conductive parts set in the sealed portions, and power being independently suppliable to each of the filaments; wherein a respective one of the coiled filaments is located in a respective first quadrant formed by intersecting planes that are perpendicular to each other and that are tangent to an outer coil diameter of the respective coiled filament; and
wherein the leads are positioned in quadrants other than the quadrant in which the coiled filament is located; and
wherein each of the filament lamps is arranged so that a region in which no leads are located is positioned facing the article to be treated.

8. Light irradiation-type heat treatment apparatus as described in claim 7, wherein multiple filament lamps of said plurality of filament lamps are arrayed in parallel and form a lamp unit.

9. Light irradiation-type heat treatment apparatus as described in claim 8, wherein a ratio Lp/L between a center-to-center distance Lp of adjacent lamps that constitute the lamp unit and a distance L from center axes of the filament lamps to the article to be treated has a value of at most 1.5.

10. Light irradiation-type heat treatment apparatus as described in claim 8, wherein other of said plurality of filament lamps are arrayed in parallel and form a second lamp unit, and wherein the lamps of one of the lamp units are arranged crosswise to lamps of the other of the lamp units.

* * * * *